(12) United States Patent
Chatty et al.

(10) Patent No.: US 7,098,513 B2
(45) Date of Patent: Aug. 29, 2006

(54) LOW TRIGGER VOLTAGE, LOW LEAKAGE ESD NFET

(75) Inventors: Kiran V. Chatty, Williston, VT (US); Robert J. Gauthier, Hinesburg, VT (US); Terence B. Hook, Jericho, VT (US); Christopher S. Putnam, Hinesburg, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,682

(22) Filed: Jan. 17, 2005

(65) Prior Publication Data

US 2006/0157799 A1 Jul. 20, 2006

(51) Int. Cl.
*H01L 29/76* (2006.01)
(52) U.S. Cl. .................. 257/382; 257/119; 257/379
(58) Field of Classification Search ................ 257/382
See application file for complete search history.

(56) References Cited

U.S. PATENT DOCUMENTS

| 5,407,849 | A | 4/1995 | Khambaty et al. |
| 5,504,362 | A | 4/1996 | Pelella et al. |
| 5,780,899 | A | 7/1998 | Hu et al. |
| 6,232,827 | B1 | 5/2001 | De et al. |
| 6,256,184 | B1 | 7/2001 | Gauthier, Jr. et al. |
| 6,316,805 | B1 | 11/2001 | Lin et al. |
| 6,563,176 | B1 | 5/2003 | Gauthier, Jr. et al. |
| 6,605,493 | B1 * | 8/2003 | Yu .............................. 438/135 |
| 6,717,220 | B1 | 4/2004 | Cheng et al. |
| 6,720,637 | B1 | 4/2004 | Voldman |
| 2002/0056882 | A1 * | 5/2002 | Gauthier et al. ............ 257/379 |
| 2003/0080382 | A1 | 5/2003 | Harada et al. |

* cited by examiner

*Primary Examiner*—Edward Wojciechowicz
(74) *Attorney, Agent, or Firm*—Gibb I.P. Law Firm, LLC; William D. Sabo, Esq.

(57) ABSTRACT

A field effect transistor with associated parasitic lateral npn bipolar junction transistor includes a source region in a substrate, a channel region in the substrate laterally adjacent to the source region, a drain region in the substrate laterally adjacent to the channel region, and a gate above the channel region of the substrate. In addition, a reduced trigger voltage region of the substrate is positioned below the drain region. The reduced trigger voltage region has a threshold voltage of about zero and comprises an undoped region of the pure wafer substrate. Thus, the reduced trigger voltage region is free of implanted N-type and P-type doping.

20 Claims, 7 Drawing Sheets

LOW TRIGGER VOLTAGE, LOW LEAKAGE ESD NFET

BACKGROUND OF THE INVENTION

1. Field of the Invention

The invention generally relates to enhancing the parasitic bipolar turn-on which is formed via the junctions of the field effect transistor. This includes a reduced trigger/turn-on voltage region (P+ zener-like implant beneath the junction) below the drain region that comprises an undoped region of the pure wafer substrate.

2. Description of the Related Art

Electrostatic charges are a constant threat to modern electronics. Therefore, electrostatic discharge protection (ESD) devices are an important component of the protection circuitry provided in today's electronic devices. As the technologies scale and the ESD protection requirements stay constant, effective ESD protection will become even more difficult in the future. This drives the need for continuous improvement and innovation in this area. To be as effective as possible, low trigger voltage ESD protection devices such as N-type field effect transistors (NFETs) are used because such devices provide effective protection (the parasitic lateral NPN beneath NFET turns on during an ESD event), decrease the area of the chip consumed, and reduce the capacitive loading of the ESD devices. An improved parasitic NPN transistor that has a low trigger voltage and low leakage and can be effectively used as an ESD protection device is presented below.

SUMMARY OF THE INVENTION

Disclosed herein is a bipolar junction transistor formed beneath a standard NFET device that includes a source region in a substrate, a channel region in the substrate laterally adjacent to the source region, a drain region in the substrate laterally adjacent to the channel region and a gate above the channel region of the substrate. The source and the drain regions have non-silicided upper surfaces. In addition, a P+ zener like implant is positioned below the drain region to reduce the trigger voltage of the bipolar junction transistor inherent to the standard NFET device. The trigger voltage of a single thick oxide NFET with the P+ zener like implant is approximately 5–6V compared to the typical trigger voltage of approximately 7–8V and 8–10V for a stacked or cascaded NFET. In addition, an undoped region of the same resistivity as the starting wafer is positioned beneath the P+ zener implant to minimize the leakage A heavily doped P+ implant is positioned in the substrate between the N-type drain region and the substrate. Beneath the P+implant region, the P-well implants have been blocked to minimize leakage (referred to as a zero-vt region, with only the starting wafer doping). The compensating implant has an opposite doping type of that of the source and drain region (In the NFET case, a P+ implant is used beneath the N+ drain junction, but opposite polarities, apply for PFETs). The structure also includes a substrate contact region in the substrate laterally adjacent the source region. This substrate contact region also has an opposite doping type to that of the source region. In another embodiment, the P-well implant beneath the substrate is blocked to enable a zero-vt region. This high resisitivity zero-vt region also helps decrease the trigger voltage of the npn bipolar junction transistor.

The reduced trigger voltage implant beneath the drain junction lowers the drain/substrate breakdown voltage of the ESD transistor. This enables a smaller drain silicide-blocked region to be used, which lowers the overall area consumed by the ESD transistor and correspondingly lowers associated capacitance. The zero-vt region beneath the substrate contact increases the substrate resistance which further helps to trigger the npn bipolar transistor at a lower lateral voltage.

These and other aspects of embodiments of the invention will be better appreciated and understood when considered in conjunction with the following description and the accompanying drawings. It should be understood, however, that the following description, while indicating embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. For example, the following describes field effect transistors (FETs) and other similar transistor devices (bipolar transistors, etc.). The processes and materials used to create the conductors, impurity regions, insulators, etc. that are used in such circuits are well-known to those ordinarily skilled in the art (see for example U.S. Pat. Nos. 6,720,637 and 6,717,220, which are incorporated herein by reference) and do not represent points of novelty of the invention. Therefore, a detailed discussion regarding the processing steps and materials used to create the following structure is intentionally omitted here from in order to focus the reader upon the salient features of the invention, and to avoid obscuring the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

Figure 1:
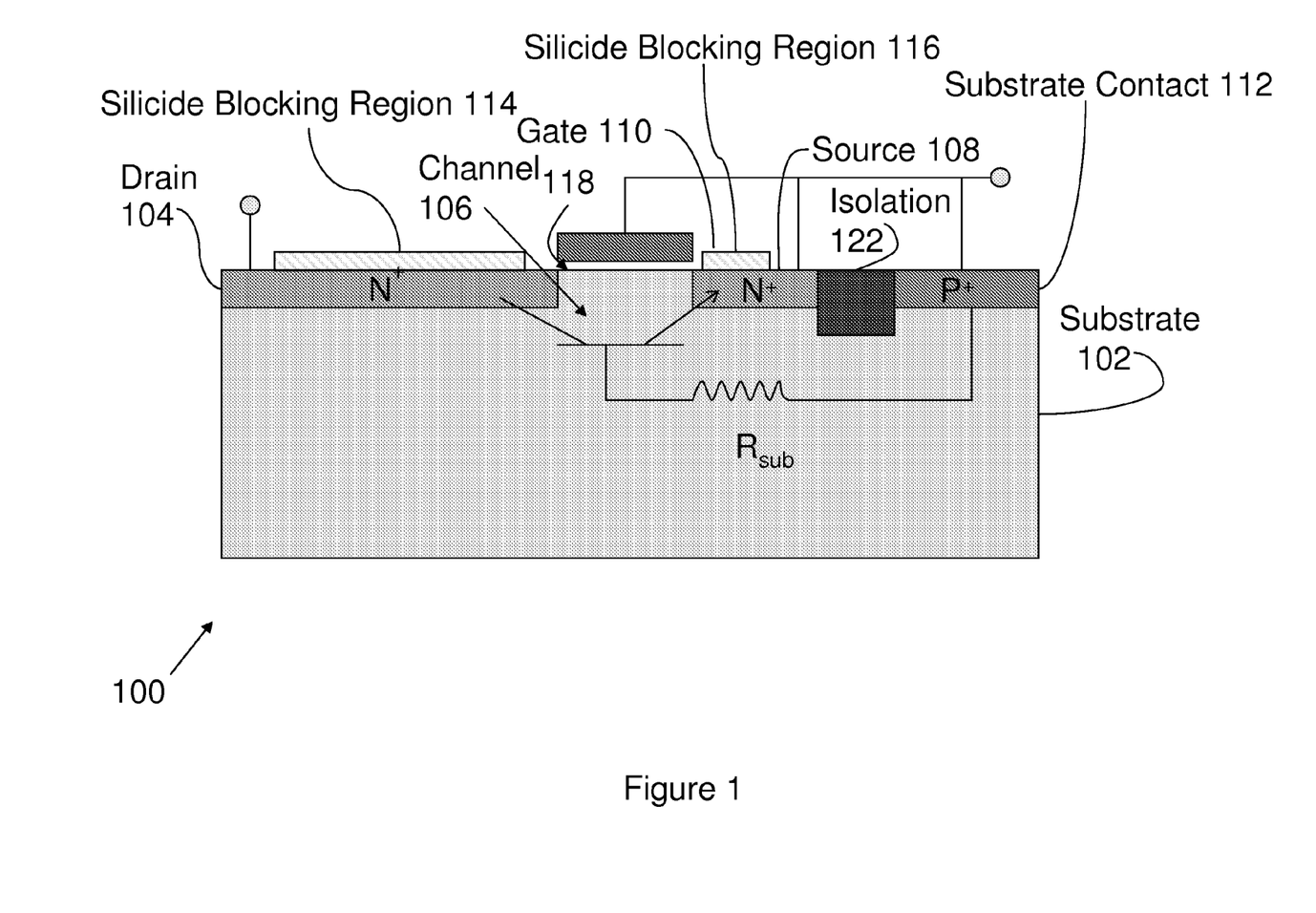
FIG. 1 is a cross-section of a non-silicided NFET with the parasitic NPN transistor shown.

Referring now to the drawings, and more particularly to FIGS. 1 through 7, there are shown embodiments of the invention. FIG. 1 illustrates the cross-section of a silicide-blocked ESD (electrostatic discharge) NFET (N-type field effect transistor). More specifically, FIG. 1 illustrates an NFET with an associated parasitic Bipolar Junction Transistor (BJT) 100 comprising a substrate 102, a drain region 104 in the substrate 102, a channel region 106 in the substrate 102 laterally adjacent to the drain region 104, a source region 108 in the substrate 102 laterally adjacent to the channel region 106, a gate 110 above the channel region 106 of the substrate 102, and a substrate contact region 112 in the substrate 102 laterally adjacent to the source region 108. The substrate contact region 112 has an opposite doping type (e.g., P-type) of that of said source region 108 (e.g., N-type). The channel region 106 has the opposite type doping of the source 108 and drain regions 104. Therefore, if the source 108 and drain 104 are doped with N-type dopants, the channel region 106 will be doped with P-type dopants. An isolation region 122 separates the source region 108 from the substrate contact region 112.

During a positive mode ESD-event, the junction between the N+drain 104 and substrate 102 (drain N+/substrate junction) breaks down and results in an avalanche generation of electrons and holes. The holes collected by the substrate 102 raise the substrate potential to near a diode turn-on voltage (For example, approximately 0.7V ($V_{sub}=I_{sub}*R_{sub}$)), forward biasing the junction between the source 108 to substrate 102 junction and turning on the source (n)-substrate (p)-drain (n) npn BJT. Thus, the source 108, the substrate 102, and the drain 104 make up the npn region of the BJT. Silicide-blocked regions 114 and 116 (such as patterned nitride, etc.) near the source 108 and drain 104 provide ballasting resistance to ensure uniform current flow. The substrate contact 112 provides sufficient bias to the substrate 102 to ensure proper operation of the BJT.

Figure 2:
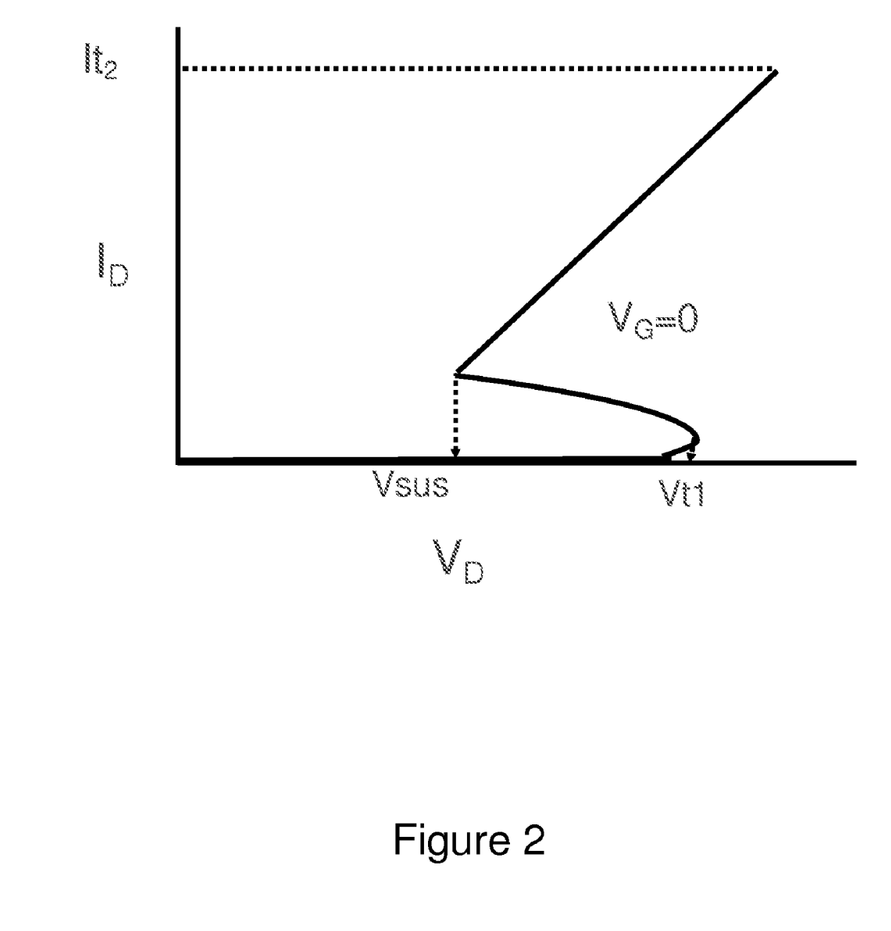
FIG. 2 is a graph showing the i–v characteristics of the silicide-blocked ESD NFET characteristics of the structure shown in FIG. 1.

The characteristics of the above silicide-blocked ESD NFET structure are shown in the graph in FIG. 2. More specifically, as shown in FIG. 2, a lower breakdown voltage of N+drain/substrate junction (104/106 junction) and/or a larger substrate 102 resistance (Rsub) is necessary to lower the trigger voltage (Vt1) of the lateral npn BJT 100. A smaller drain silicide-blocked region 114 is desirable to decrease the area of ESD-NFET 100 and the capacitance of ESD device 100.

Figure 3:
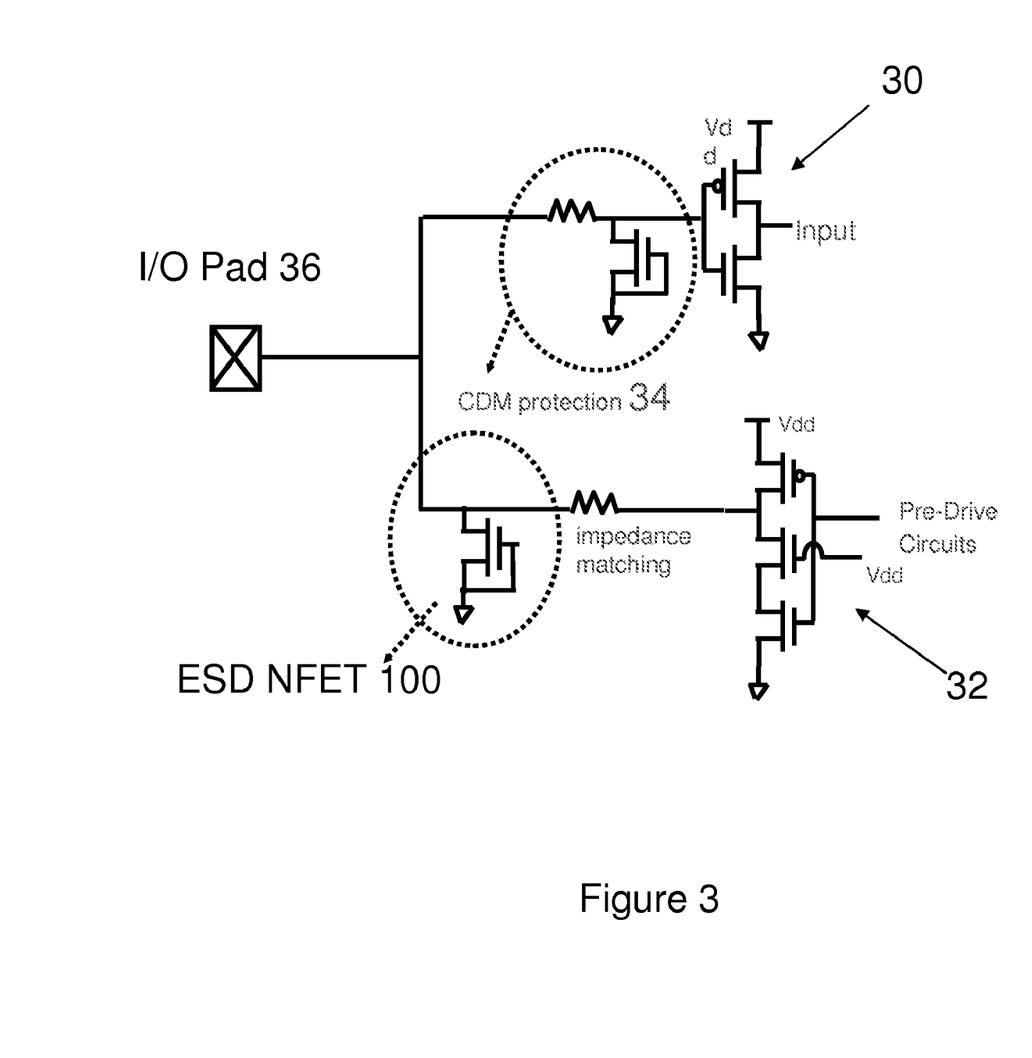
FIG. 3 is a schematic diagram of a circuit illustrating an NMOS-based non-self ESD strategy.

FIG. 3 illustrates an NMOS/Lnpn (N-type Metal Oxide Semiconductor/Lateral npn BJT)-based non-self protecting ESD strategy using the device 100. More specifically, item 30 represents an input circuit and item 32 represents the output driver circuits. Item 34 is the Charge Device Model (CDM) protection circuit and item 100 is the ESD NFET, as shown in the other figures presented herein. Item 36 represents the input/output pad. During a positive mode ESD event, the ESD NFET/Lnpn 100 triggers and discharges current to ground. During a negative mode ESD event, the N+/substrate diode (104/106) of the ESD NFET 100 discharges the current to ground. The trigger voltage of the ESD device 100 should be lower than the gate oxide breakdown voltage of the gates in the receiver circuit 30, and lower than the snapback voltage of output driver 32 for all ESD events-CDM, MM (Machine Model) and HBM (Human Body Model) for effective protection.

Figure 4:
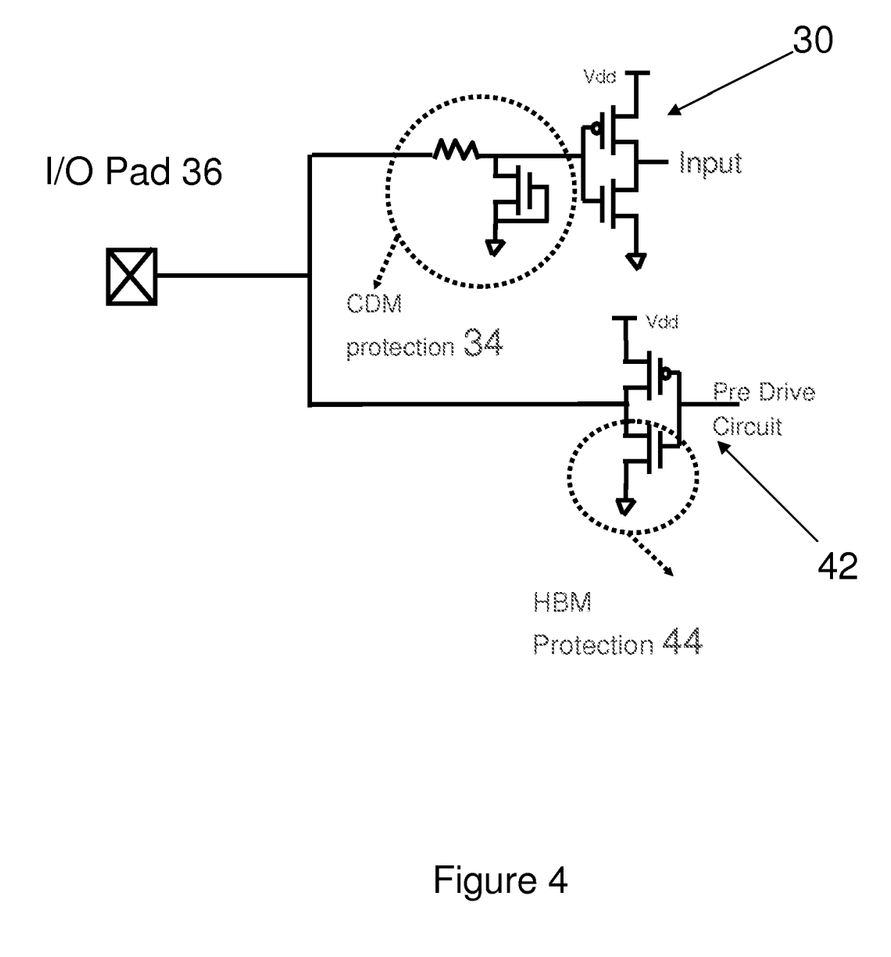
FIG. 4 is a schematic diagram of a circuit illustrating an NMOS-based self-protecting ESD strategy.

FIG. 4 illustrates an NMOS-based self-protecting ESD Strategy using the device 100 as item 44. This is similar to the structure illustrated in FIG. 3; however, the HBM protection circuit 44 is included within the output driver 42. More specifically, in this self-protecting strategy, the output driver 42 also functions as an ESD device. In mixed voltage applications, the output driver 42 is typically a stacked NFET as shown in FIG. 3. For example, for 3.3V applications, the driver 42 might be two series 2.5V NFETs as shown in FIG. 3. Also, the trigger voltage of the ESD device 100 shown in FIG. 3 should be lower than the breakdown voltage of the receiver gate 40 and the output driver 32 for all modes of ESD events-HBM, MM and CDM.

For mixed voltage I/O applications, one example of a scenario that requires a lower trigger voltage ESD device could include a bidirectional 3.3V I/O (e.g., having a driver 32, 42 and receiver 30) that uses a self-protected ESD strategy using a silicide-blocked 2.5V ESD NFET similar to the one shown in FIG. 1. If the snapback voltage of the stacked NFET 32, 42, is 11V and the breakdown voltage of the receiver gate 30 is approximately 10–11V, the stacked device 32, 42 will not be able to protect the 2.5V gate 30 during an HBM event. Further, a stacked 2.5V ESD NFET can require a minimum of 4 um silicide-blocking 114 on the drain side, which is relatively large, and which carries very high capacitance and area costs.

Figure 5:
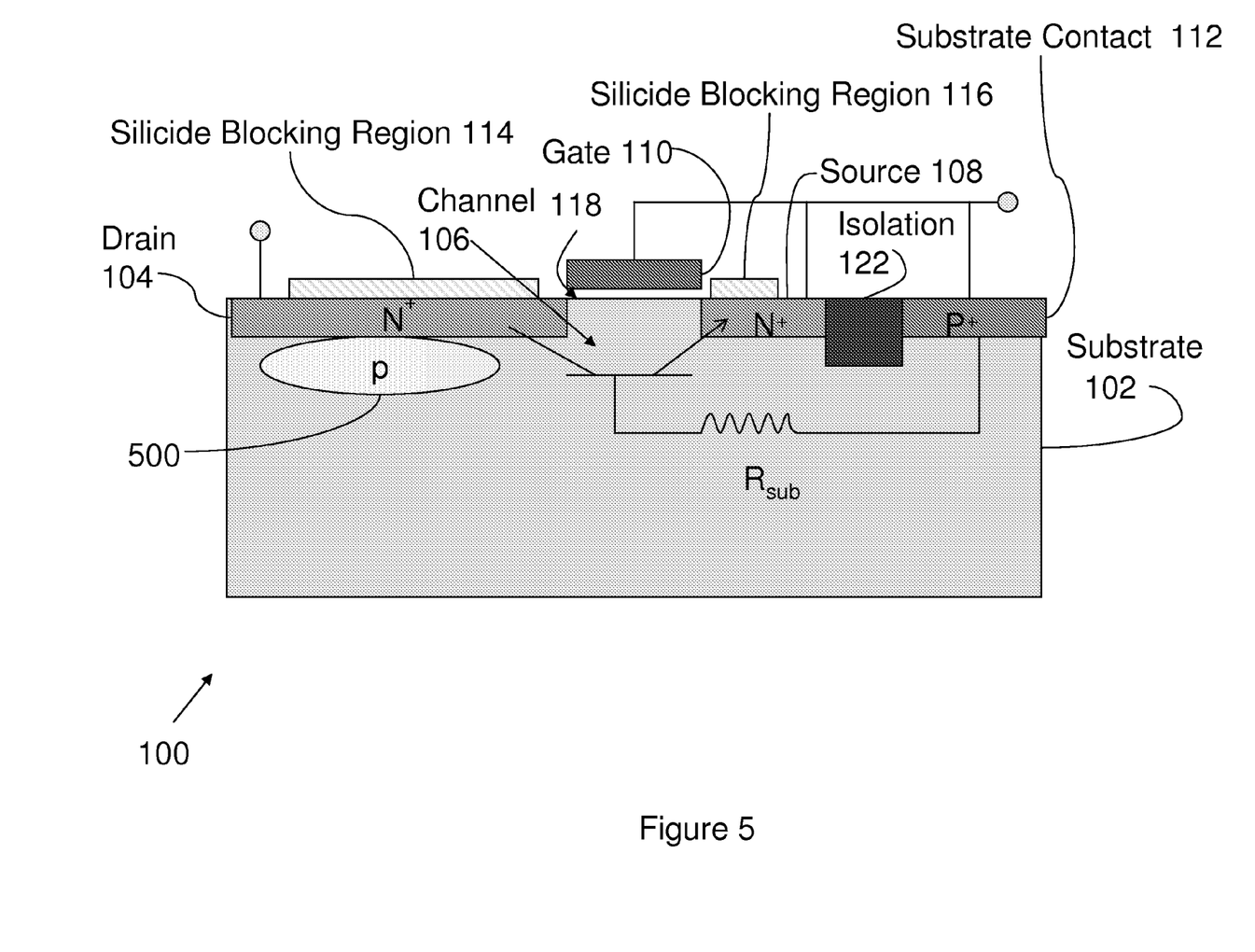
FIG. 5 is a cross-section diagram of a transistor with the P+ zener like implant.

One solution to this problem is to lower trigger voltage of ESD NFET by lowering breakdown voltage of N+ drain to substrate junction by adding a compensating implant 500 below the drain region 104 that has an opposite doping type of that of the drain region 104, as shown in FIG. 5. More specifically, this p-type region 500 is implanted beneath the drain junction 104 to lower drain 104/channel 106 (N+/substrate) junction breakdown voltage and thereby enable the use of a smaller drain region, which reduces the area consumed by the silicide 114 and similarly reduces capacitance.

Figure 6:
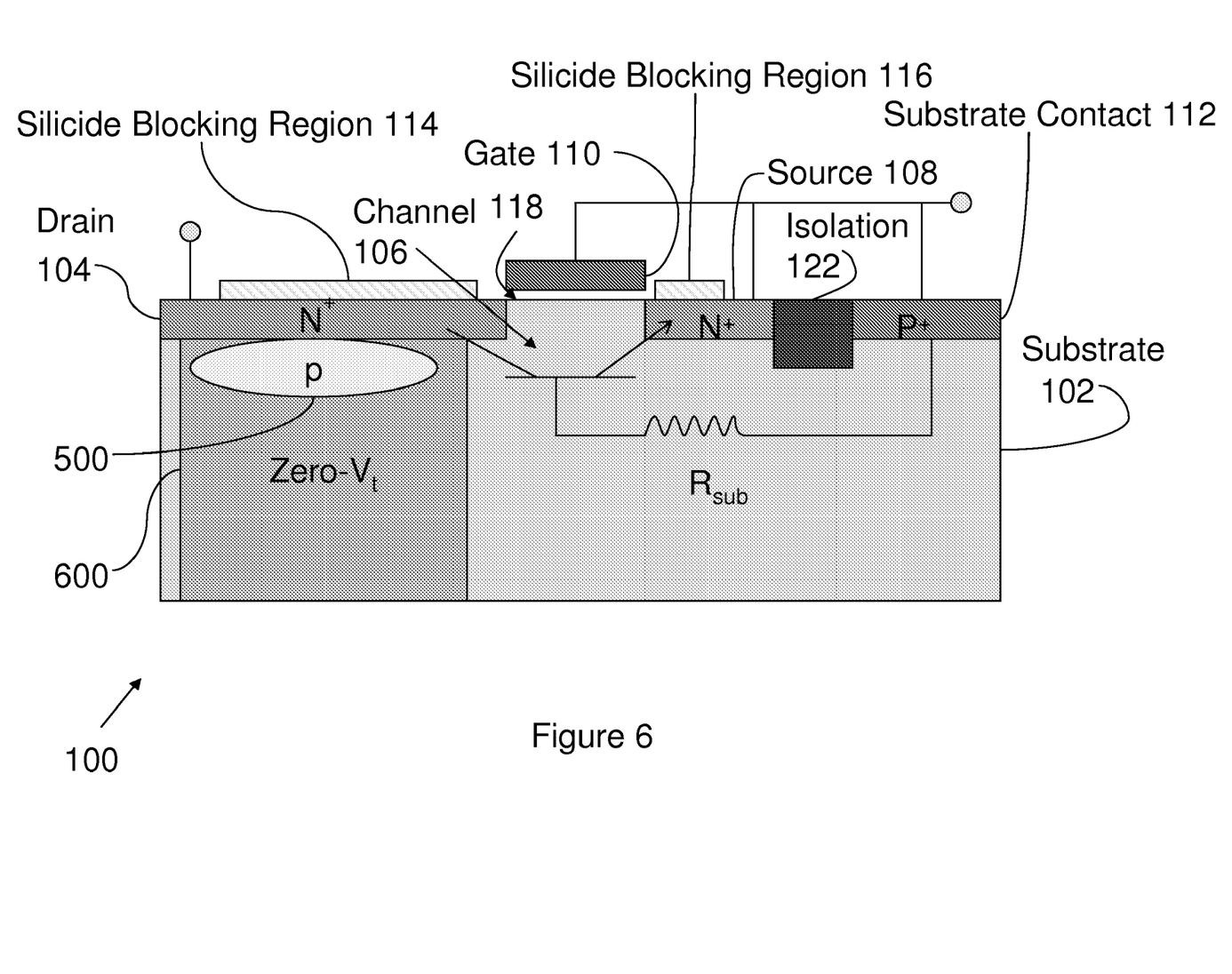
FIG. 6 is a cross-section diagram of a transistor with the P+ zener like implant shown along with the zero-Vt region under the drain junction.
Figure 7:
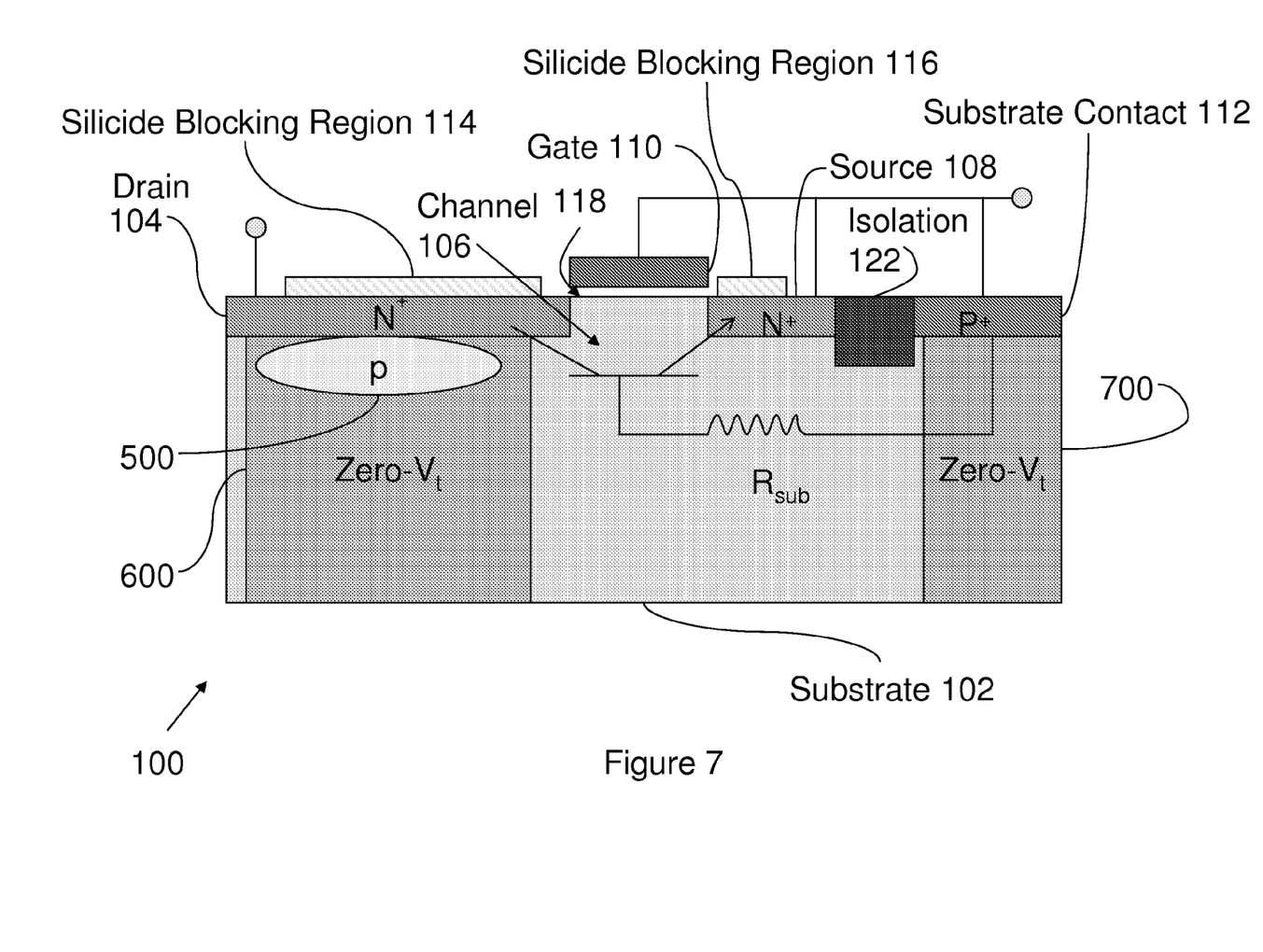
FIG. 7 is a cross-section schematic diagram of a transistor with the P+ zener like implant shown along with the zero-Vt region under the drain and substrate contact regions.

The (P+ zener like) compensating implant 500 can result in high leakage current due to implant damage from deep well implants. Therefore, as shown in FIG. 6, the P-well implant is blocked beneath the implant 500 resulting in what is referred to as a zero-Vt region 600. The zero-Vt region formed beneath the drain junction 104 and compensating implant 500 prevents defect formation and results in the reduction of the leakage current. The reduced threshold voltage region 600 lowers N+ drain 104/substrate 102 breakdown voltage of the ESD NFET 100 to enable a smaller drain silicide-blocked region 114 to be used and therefore, smaller NFET area and associated capacitance. The zero-Vt region also increases substrate resistance to lower lateral n-p-n trigger voltage of ESD-NFET. Also, as shown in FIG. 7, the zero-Vt region 700 can be introduced beneath the substrate contact 112 which increases the substrate resistance and further lowers the parasitic Lnpn trigger voltage. Both reduced zero-Vt regions 600, 700 have a high sheet resistance (e.g., higher than channel region 106) for a lightly doped non-epi wafers. Since there are no well implants in this region, only the starting wafer doping determines the sheet resistance in these regions.

Thus, as shown in FIGS. 6 and 7, embodiments herein include a bipolar junction transistor with an associated parasitic bipolar junction transistor. While an NFET type ESD is illustrated in the Figures, one ordinarily skilled in the art would understand that opposite polarity dopants could be used with the invention depending upon the specifics of the design. Therefore, for example, a P-type field effect transistor (PFET) embodiment of the invention could utilize the same principles discussed herein and the invention is intended to encompass all such structures. The various masking, impurity implanting, patterning, and other similar processing steps used to form the structures in FIGS. 6 and 7 would be well-known to those ordinarily skilled in the art given this disclosure. For example, U.S. Pat. No. 5,504,362 and U.S. Patent Publication 2003/0080382 (incorporated herein by reference) illustrate many processing steps used to form bipolar ESD transistors. While none of the references incorporated herein disclose the inventive structure, they demonstrate that one ordinarily skilled in the art would readily understand how to make and use the inventive structure disclosed herein. During manufacturing, masking and other well-known processing steps are utilized to prevent the reduced threshold regions 600, 700 from receiving any form of doping, such that these regions will remain essentially unaltered regions of the original wafer from which the substrate 102 was developed.

As shown in FIGS. 6 and 7, the source region 108 is in the substrate, the channel region 106 is in the substrate laterally adjacent to the source region 108, the drain region 104 is in the substrate laterally adjacent to the channel region 106, a gate conductor 110 is above the channel region 106 of the substrate, and a gate oxide 118 is between the channel region 106 and the gate 110. The source region 108 and the drain region 104 can have non-silicided upper surfaces 114, 116. The zero-vt region 600 of the substrate is positioned below the drain region 104. The zero-vt region 600 comprises an undoped region of the pure wafer substrate 102. Thus, the zero-Vt region 600 is free of implanted N-type and P-type doping (starting wafer dopant only in these regions).

The compensating implant 500 and the zero-vt region 600 are positioned in the substrate 102 under the drain region 104 and far enough away from the channel region so as not to affect the NFET's threshold voltage. The compensating implant 500 has an opposite doping type of that of the source 108 and drain region 104. The structure also includes a substrate contact region 112 in the substrate 102 laterally adjacent to the source region 108. This substrate contact region 112 also has an opposite doping type of that of the source region 108. A second zero-vt region 700 of the substrate is below the substrate contact region 112. The second zero-Vt region 700 comprises an undoped region of the pure wafer substrate 102. Thus, the second zero-vt region is also free of N-type and P-type implanted doping (starting wafer dopant only in these regions).

Thus, as shown above, the P+ zener implant 500 and the zero-vt regions 600, 700 lower the drain 104/substrate 102 breakdown voltage and increase the substrate resistance to lower the trigger voltage of the ESD transistor 100. This enables a smaller drain silicide-blocked region 114 to be used, which lowers the overall area consumed by the ESD transistor and correspondingly lowers associated capacitance.

The foregoing description of the specific embodiments will so fully reveal the general nature of the invention that others can, by applying current knowledge, readily modify and/or adapt for various applications such specific embodiments without departing from the generic concept. Therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A transistor device comprising a parasitic bipolar junction device under a field effect transistor, said transistor device comprising:
    a substrate;
    a source region in said substrate,
    a channel region in said substrate laterally adjacent said source region;
    a drain region in said substrate laterally adjacent said channel region;
    a gate above said channel region of said substrate; and
    a reduced threshold voltage region of said substrate only below said drain region, wherein said reduced threshold voltage region has a lower threshold voltage than said substrate.

2. The transistor device in claim 1, further comprising a compensating implant in said substrate between said drain region and said reduced threshold voltage region.

3. The transistor device in claim 2, wherein said compensating implant has an opposite doping type of that of said drain region.

4. The transistor device in claim 1, further comprising a substrate contact region in said substrate laterally adjacent to said source region, wherein said substrate contact region has an opposite doping type of that of said source region.

5. The transistor device in claim 4, further comprising a secondary reduced threshold voltage region of said substrate below said substrate contact region.

6. The transistor device in claim 1, wherein, said source region and said drain region have non-silicided upper surfaces.

7. The transistor device in claim 1, wherein, said reduced threshold voltage region is free of impurities in said channel region.

8. A bipolar junction N-type field effect transistor comprising:
    a substrate;
    a N-type source region in said substrate,
    a P-type channel region in said substrate laterally adjacent to said source region;
    a N-type drain region in said substrate laterally adjacent to said channel region;
    a gate above said channel region of said substrate; and
    a reduced threshold voltage region of said substrate only below said drain region that is free of N-type and P-type doping.

9. The transistor in claim 8, further comprising a compensating implant in said substrate between said drain region and said reduced threshold voltage region.

10. The transistor in claim 9, wherein said compensating implant has P-type doping.

11. The transistor in claim 8, further comprising a substrate contact region in said substrate laterally adjacent to said source region, wherein said bias region has P-type doping.

12. The transistor in claim 11, further comprising a secondary reduced threshold voltage region of said substrate below said substrate contact region.

13. The transistor in claim 8, wherein, said source region and said drain region have silicided upper surfaces.

14. The transistor in claim 8, wherein, said reduced threshold voltage region comprises an undoped wafer material.

15. A bipolar junction transistor comprising:
a pure wafer substrate;
a source region in said substrate,
a channel region in said substrate laterally adjacent to said source region;
a drain region in said substrate laterally adjacent to said channel region;
a gate above said channel region of said substrate; and
a reduced threshold voltage region of said substrate only below said drain region that comprises an undoped region of said pure wafer substrate.

16. The transistor in claim 15, further comprising a compensating implant in said substrate between said drain region and said reduced threshold voltage region.

17. The transistor in claim 16, wherein said compensating implant has an opposite doping type of that of said drain region.

18. The transistor in claim 15, further comprising a substrate contact region in said substrate laterally adjacent to said source region, wherein said bias region has an opposite doping type of that of said source region.

19. The transistor in claim 18, further comprising a secondary reduced threshold voltage region of said substrate below said substrate contact region.

20. The transistor in claim 15, wherein, said source region and said drain region have silicided upper surfaces.

* * * * *